United States Patent
Khaliq et al.

(10) Patent No.: US 12,035,632 B2
(45) Date of Patent: Jul. 9, 2024

(54) FLEXIBLE AND LOW COST PIEZOELECTRIC COMPOSITES WITH HIGH $d_{33}$ VALUES

(71) Applicant: SABIC GLOBAL TECHNOLOGIES B.V., Bergen op Zoom (NL)

(72) Inventors: Jibran Khaliq, Delft (NL); Sybrand Van Der Zwaag, Delft (NL); Wilhelm Albert Groen, Delft (NL); Jesus Alfonso Caraveo-Frescas, Thuwal (SA)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 920 days.

(21) Appl. No.: 16/981,476

(22) PCT Filed: Mar. 18, 2019

(86) PCT No.: PCT/IB2019/052179
§ 371 (c)(1),
(2) Date: Sep. 16, 2020

(87) PCT Pub. No.: WO2019/180586
PCT Pub. Date: Sep. 26, 2019

(65) Prior Publication Data
US 2021/0028347 A1   Jan. 28, 2021

Related U.S. Application Data

(60) Provisional application No. 62/645,509, filed on Mar. 20, 2018.

(51) Int. Cl.
*H10N 30/85*   (2023.01)
*H10N 30/092*  (2023.01)
(Continued)

(52) U.S. Cl.
CPC ......... *H10N 30/852* (2023.02); *H10N 30/092* (2023.02); *H10N 30/098* (2023.02); *H10N 30/857* (2023.02)

(58) Field of Classification Search
CPC .. H10N 30/852; H10N 30/098; H10N 30/857; H10N 30/092
See application file for complete search history.

(56) References Cited

U.S. PATENT DOCUMENTS

| 4,128,489 A | 12/1978 | Seo |
| 4,330,593 A * | 5/1982 | Shrout ............... H10N 30/8554 428/407 |

(Continued)

FOREIGN PATENT DOCUMENTS

| CN | 103682080 | * | 3/2014 |
| CN | 106543606 A | | 3/2017 |
| KR | 10-1417855 B1 | | 7/2014 |

OTHER PUBLICATIONS

Chen et al.; "0-3 Piezoelectric composite film with high d33 coefficient"; Sensors and Actuators A: Physical; vol. 65; Mar. 1998; p. 194-196 (abstract only).

(Continued)

*Primary Examiner* — C Melissa Koslow
(74) *Attorney, Agent, or Firm* — Womble Bond Dickinson (US) LLP

(57) ABSTRACT

The disclosure concerns filled a polymer composite comprising a piezoelectric filler and a polymer resin. The composite may exhibit a piezoelectric coefficient d33 of greater than 30 pC/N when measured according to the Berlincourt Method using a d33 piezometer and a density of less than 5 g/cc according to the Archimedes method.

19 Claims, 6 Drawing Sheets

(51) Int. Cl.
*H10N 30/098* (2023.01)
*H10N 30/857* (2023.01)

(56) References Cited

U.S. PATENT DOCUMENTS

| | | | | |
|---|---|---|---|---|
| 4,994,703 | A | * | 2/1991 | Oguri ............... H10N 30/872 |
| | | | | 29/25.35 |
| 5,951,908 | A | | 9/1999 | Cui et al. |
| 7,842,390 | B2 | | 11/2010 | Chung et al. |
| 2008/0081195 | A1 | | 4/2008 | Chung et al. |
| 2011/0233451 | A1 | * | 9/2011 | Kurbanov .......... H10N 30/8554 |
| | | | | 252/62.9 PZ |
| 2014/0060210 | A1 | | 3/2014 | Jeon et al. |
| 2014/0210309 | A1 | * | 7/2014 | Miyoshi ............... H04R 17/005 |
| | | | | 310/313 A |
| 2015/0200351 | A1 | * | 7/2015 | Zawada ............... H10N 30/852 |
| | | | | 252/62.9 PZ |
| 2017/0018700 | A1 | | 1/2017 | Miyoshi et al. |
| 2017/0141291 | A1 | | 5/2017 | Aliane et al. |
| 2017/0373243 | A1 | * | 12/2017 | Ozawa ................. B06B 1/0607 |
| 2018/0013359 | A1 | | 1/2018 | Park et al. |

OTHER PUBLICATIONS

Choi et al.; "Dielectric and piezoelectric properties of ceramic-polymer composites with 0-3 connectivity type"; J. Electroceram; vol. 30; 2013; p. 30-35.

Dong et al.; "Effect of heat treatment on the electrical properties of lead zirconate titanate/poly (vinylidene fluoride) composites"; Polym Int; vol. 59; 2010; p. 756-758.

Han et al.; "Highly enhanced piezoelectric properties of PLZT/PVDF composite by tailoring the ceramic Curie temperature, particle size and volume fraction"; Sensors and Actuators A: Physical; vol. 204; 2013; p. 74-78.

Chang et al.; "Large d33 and Enhanced Ferroelectric/ Dielectric Properties of Poly(vinylidene fluoride)-based Composites Filled with Pb(Zr0.52Ti0.48)O3 Nanofibers"; RSC Advances; vol. 5; 2015; p. 51302-51307.

Tiwari et al.; "Structural, dielectric and piezoelectricproperties of 0-3 PZT/PVDF composites"; Ceramic Int'l; vol. 41; 2015; p. 8008-8013.

Tiwari et al.; "Enhanced dielectric and piezoelectric properties of 0-3 PZT/PVDF composites"; J. Polym Res; vol. 23; 2016; 6 pages.

Lee et al.; "Preparation of PbTiO3 Powder for a Flexible 0-3 Piezoelectric Composite"; IEEE Proc. 6$^{th}$ Int. Symp. Applic. Ferroelectr.; 1986; p. 318-321 (abstract only).

Bauer et al.; "Advances in relaxor ferroelectric terpolymer: New applications"; IEEE Int'l Symposium on Applications of Ferroelectrics and Int'l Symposium on Piezoresponse Force Microscopy and Nanoscale Phenomena in Polar Materials; 2011; p. 53-56 (abstract only).

Bauer et al.; "Relaxor fluorinated polymers: novel applications and recent developments"; IEEE Transactions on Dielectrics and Electrical Insulation; vol. 17; 2010; p. 1106-1112.

International Patent Application No. PCT/IB2019/052179; Int'l Search Report and the Written Opinion; dated Jul. 5, 2019; 12 pages.

International Patent Application No. PCT/IB2019/052179; Int'l Preliminary Report on Patentability; dated Oct. 1, 2020; 8 pages.

* cited by examiner

FLEXIBLE AND LOW COST PIEZOELECTRIC COMPOSITES WITH HIGH $d_{33}$ VALUES

CROSS-REFERENCE TO RELATED APPLICATION

This application is the National Stage of International Application No. PCT/IB2019/052179 filed Mar. 18, 2019, which claims the benefit of U.S. Provisional Application No. 62/645,509 filed Mar. 20, 2018, the disclosures of which are incorporated herein by this reference in their entireties.

TECHNICAL FIELD

The disclosure relates to relates to the piezoelectric material arts, sensor arts, actuator arts, and related arts.

BACKGROUND

Piezoelectric elements are used as sensors, actuators, and energy harvesting devices. Piezoelectric materials compress or expand when subjected to an electric potential, or conversely, produce a voltage in response to an applied mechanical force. Conventional piezoelectric composites are known in the art and typically comprise piezoelectric fibers within in a protective polymer resin matrix. Piezoelectric composites general exhibit greater flexibility and are more conformable than monolithic piezoelectric wafers. Accordingly, piezoelectric composite materials are used in diverse applications, such as pressure sensors, touch-sensitive buttons or other user interface controls, audio speakers, microphones, actuators, and so forth. One such known piezoelectric composite material which comprises an acetal resin, a polymer of high dielectric permittivity, and a piezoelectric powder is disclosed in U.S. Pat. No. 4,128,489 to I. Seo. This piezocomposite material possesses good formability and elasticity. However, it has a relatively low piezoelectric sensitivity, high dielectric losses, and a low electromechanical coefficient of efficiency.

U.S. Pat. No. 7,842,390 to Tze-Chiang Chung, et. al, discloses piezoelectric composites having a good electric properties (i.e., a dielectric constant of at least 10) and good chemical reactivity. The materials feature a chain-end functionalized fluoropolymer and a dielectric material. However, performance of piezoelectricity and flexibility of the materials is not evaluated. Disadvantages of the material include the required functionalization of the polymer and the associated costs.

Chinese Patent Application CN 106543606 to Shanghai Jiao Tong University provides a polymer composite dielectric for high energy storage density. The composite comprises a fluorine containing ferroelectric polymer matrix and a dopamine-modified high dielectric constant nano-filler (nano ceramic particles). Similarly, disadvantages of the material include required functionalization of the piezoelectric filler, additional processing, and the associated costs.

There remains a need in the art for piezoelectric composite materials that exhibit high dielectric and piezoelectric properties, desirable mechanical performance, and are scalable with an ease of manufacture.

SUMMARY

Aspects of the present disclosure relate to a composite comprising: a piezoelectric filler; and a polymer resin, wherein the composite exhibits a piezoelectric coefficient $d_{33}$ of greater than 30 Picocoulombs per Newton (pC/N) when measured according to the Berlincourt Method using a d33 piezometer, the composite exhibits a poling voltage lower is oriented at a poling voltage lower than that of a substantially similar polymer matrix in the absence of the piezoelectric filler, the composite exhibits an elastic modulus of less than 30 gigapascal (GPa) when tested according to ASTM D3039, and the composite exhibits a density of less than 5 grams per cubic centimeter (g/cc) according to the Archimedes method. In some examples, the composite exhibits a dielectric constant dk greater than 100 when derived from capacitance measurement at 1 kilohertz (kHz) and 1 volt (V).

Other aspects of the present disclosure relate to a composite comprising: a polymer resin; and a piezoelectric filler, wherein the piezoelectric filler is present in an amount from about 30 volume percent (vol %) to about 70 vol % based on the total volume of the composite, the composite exhibits a piezoelectric coefficient $d_{33}$ of greater than 30 pC/N when measured according to the Berlincourt Method using a $d_{33}$ piezometer, the composite is oriented at a poling voltage lower than a substantially similar polymer matrix in the absence of the piezoelectric filler when subjected to an electric field, the composite exhibits an elastic modulus of less than 30 gigapascals GPa when tested according to ASTM D3039, and the composite exhibits a density of less than 5 g/cc according to the Archimedes method.

In yet other aspects, the present disclosure relates to a method of forming a composite comprising a polymer resin, and a piezoelectric filler. One aspect of the subject disclosure is the formation of piezoelectric and flexible composites through a casting of a solution mixed with a piezoelectric filler and a polymer, such as a ferroelectric polymer In certain aspects, the disclosure relates to a method of forming an article including the steps of molding an article from the polymer composite described herein.

BRIEF DESCRIPTION OF THE DRAWINGS

The above-mentioned and other features and advantages of this disclosure, and the manner of attaining them, will become apparent and be better understood by reference to the following description of an aspect of the disclosure in conjunction with the accompanying drawings, wherein.

Figure 1:
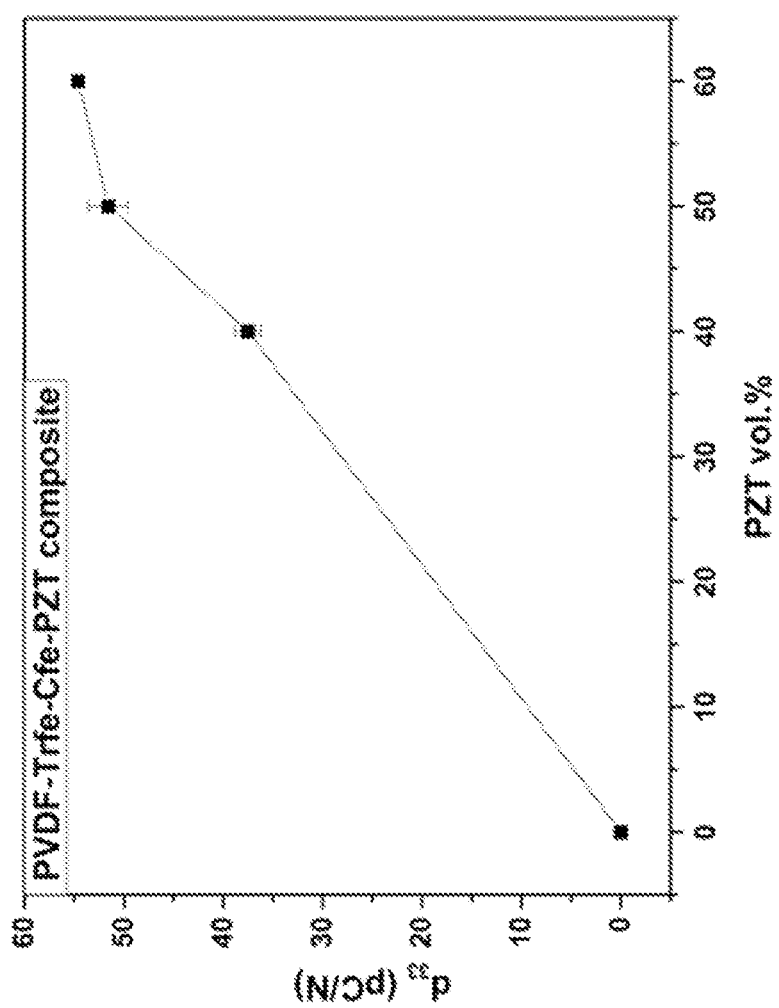
FIG. 1 is a graphical representation of the variation of the piezoelectric constant $d_{33}$ with increasing lead zirconate titanate $(Pb[Zr_{(x)}Ti_{(1-x)}]O_3, 0 \le x \le 1)$ PZT volume fraction.

Additional advantages of the disclosure will be set forth in part in the description which follows, and in part will be obvious from the description, or can be learned by practice of the disclosure. The advantages of the disclosure will be realized and attained by means of the elements and combinations particularly pointed out in the appended claims.

DETAILED DESCRIPTION

Piezoelectric ceramics are often bulky or rigid such that they are ill-suited for certain applications. Growing fields of electromagnetic articles trend towards simplification, thinness, shortness and smallness. Conventional piezoelectric composites are known in the art and typically feature a piezoelectric filler material in a protective polymer resin, such as a ferroelectric polymer. Preferably, the polymeric material has superior molding processability and flexibility, and is easy to make large in area and possible to produce in large quantities. Such piezoelectric composites generally exhibit greater flexibility while maintaining the desired piezoelectric properties. Bodies of thick-film type or sheet-forms Poly(vinylidene fluoride (PVDF)or PVDF-based materials are used for commercial applications. These materials or devices however require higher poling voltages (i.e., about 60 kilovolt per millimeter KV/mm) to reach the appropriate poling state and are typically expensive to produce. Ceramics are heavy as they tend to have higher densities (i.e., 7.86 g/cc). In the case of composites, the density decreases up to 50%. The lower density provides higher structural integrity. While ferroelectric polymers are polymers and have improved modulus and may be less dense compared to piezoelectric ceramic fillers, the polymers may suffer low field sensitivities, such as dielectric constant, piezoelectric coefficient, electromechanical coupling factor and field induced strain. These constraints severely limit the application of ferroelectric polymers as transducers, sensors and actuators. Polymer composites of the present disclosure however exhibit a high dielectric constant, low poling voltage (about 10 KV/mm), maintain flexibility even at higher filler loadings, lower density (about 5 g/cc), and generate a large electric displacement or/and mechanical actuation. Moreover, the present piezoelectric composites are produced via an efficient solution casting process.

The present disclosure provides a piezoelectric material with high piezoelectric charge constant values (greater than 50 pC/N) when tested in accordance with the Berlincourt Method using a d33 piezometer. As an example, the $d_{33}$ meter may be a Piezotest $d_{33}$ piezometer PM300. The disclosed composites comprise an electroactive/ferroelectric polymer and a piezoelectric filler. (A maximum value of 55.5 pC/N at 60 vol. % PZT was achieved). The disclosed piezoelectric composites may provide a combination of flexibility and high piezoelectric properties. The composites remains mechanically flexible even at high filler loading (i.e., 60 vol %).

In an aspect, the piezoelectric composite may comprise a ferroelectric polymer and from about 30 vol % to about 70 vol % of a piezoelectric filler.

Polymer Resin

The piezoelectric composites of the present disclosure may comprise a polymer resin matrix. In various aspects, the polymer resin matrix may comprise an electroactive or ferroelectric polymer. Electroactivity may refer to a polymer's change in size or shape when stimulated by an electric field. Ferroelectricity may refer to a material's permanent electric polarization that varies in strength with the applied electric field. Ferroelectric and electroactive polymers are commonly applied as actuators and sensors.

Exemplary ferroelectric fluoropolymers may include but are not limited to Poly(vinylidene fluoride) (PVDF) and its copolymer with trifluoroethylene P(VDF-TrFE). PVDF and PVDF-TrFE may represent conventional piezoelectric fluoropolymers used. In the poled ferroelectric phase, these fluoro polymers may exhibit relatively high piezoelectric response and have found a broad range of applications. PVDF and the copolymers thereof (e.g. TrFE, TFE) are useful for piezoelectric materials. PVDF, has a sound impedance of 4 Mrayl and is often used for transducers requiring especially low sound impedance. However, has a low dielectric constant (dk about equal to 10), and has high dielectric loss relative to ceramic piezoelectric fillers described elsewhere herein. PVDF and PVDF-TrFE have a dielectric constant in the range 7 to 15.

Further exemplary ferroelectric fluoropolymers may comprise fluoropolymer, such as a PVDF-based fluoropolymer, which may include homopolymers, copolymers, terpolymers, or other polymers of vinylidene fluoride (also termed vinylidene difluoride, or VDF). Example polymers include polyvinylidene fluoride (PVDF), poly(vinylidene fluoride-co-chlorotrifluoroethylene) (PVDF-CTFE), poly(vinylidene fluoride-co-hexafluoropropylene) (PVDF-HFP), poly(vinylidene fluoride-co-chlorofluoroethylene) (PVDF-CFE), poly(vinylidene fluoride-co-chlorodifluoroethylene) (PVDF-CDFE), poly(vinylidene fluoride-co-trifluoroethylene-co-chlorofluoroethylene) (PVDF-TrFE-CFE), poly(vinylidene fluoride-co-trifluoroethylene-co-chlorotrifluoroethylene) (PVDF-TrFE-CTFE), poly(vinylidene fluoride-co-trifluoroethylene-co-hexafluoropropylene) (PVDF-TrFE-HFP), poly(vinylidene fluoride-co-trifluoroethylene-co-chlorodifluoroethylene) (PVDF-TrFE-CDFE), poly (vinylidene fluoride-co-tetrafluoroethylene-co-chlorofluoroethylene) (PVDF-TFE-CFE), poly(vinylidene fluoride-co-tetrafluoroethylene-co-chlorotrifluoroethylene) (PVDF-TFE-CDFE), poly(vinylidene fluoride-co-tetrafluoroethylene-co-hexafluoropropylene) (PVDF-TFE-HFP), poly(vinylidene fluoride-co-tetrafluoroethylene-co-chlorodifluoroethylene) (PVDF-TFE-CDFE). Examples also include derivatives of such polymers. Examples also include blends comprising one or more of such polymers, or derivatives thereof.

In certain aspects of the present disclosure, the polymer resin matrix is a polyvinylidene fluoride derivative. Specifically, the polymer resin matrix may comprise a relaxor ferroelectric fluoropolymer such as poly(vinylidene fluoride-trifluoroethylene-chlorofluoroethylene) (PVDF-TrFE-CFE).

Certain aspects of the composition include from about 10 wt. % to about 70 wt. % of a polymer base resin. In further aspects, the composition includes from about 20 wt. % to about 70 wt. % of a polymer base resin, or from about 30 wt. % to about 50 wt. % of a polymer base resin, or from about 30 wt. % to about 45 wt. % of a polymer base resin.

Ceramic Filler

The piezoelectric composite of the present disclosure may comprise a ceramic filler, specifically a piezoelectric filler. Exemplary piezoelectric fillers include piezoelectric lead zirconate titanate (PZT) and barium titanate (BT) ceramics. The piezoelectric constant $d_{33}$ of PZT and BT are very high (about 100 to 600 pC/N). These ceramic fillers also have a high dielectric constant (about 1000 to 4000). The present disclosure utilizes piezoelectric ceramics that have a low dielectric constant, a high do value, low dielectric loss, and a piezoelectric sensitivity $d_{33}$ of at least 100 pC/N.

Typical examples of the ceramic piezoelectric fillers that are useful in the present disclosure may include, but are not limited to, lead based ceramic fillers. In a specific aspect, the piezoelectric filler is lead based. More particularly, the piezoelectric filler comprises lead zirconium titanate (PZT).

In various aspects, the piezoelectric filler is a particulate dispersed throughout the polymer resin matrix. The piezoelectric filler may have a size of a few micrometers, rather than nano-particulate size. The piezoelectric filler may comprise a particulate having an average particle size of greater than 0.5 micrometers (μm). The piezoelectric filler may comprise a particulate having an average particle size of from 0.5 μm to about 100 μm.

According to various aspects of the present disclosure, the piezoelectric composites are casted, i.e., solution casted. The piezoelectric filler may be present in a particular volume fraction. Specifically, the piezoelectric filler may be present rom about 30 vol % to about 70 vol % based on the total volume of the solution caste for the dissolved polymer. In further examples, the piezoelectric filler may be present in amount from about 30 vol % to about 60 vol %, from about 30 vol % to about 40 vol %, from about 30 vol % to about 50 vol %, from about 40 vol % to about 50 vol %, from about 40 vol % to about 45 vol %, from about 40 vol % to about 55 vol %, from about 40 vol % to about 60 vol %, from about 40 vol % to about 65 vol %, from about 50 vol % to about 60 vol %, from about 50 vol % to about 55 vol %, from about 50 vol % to about 70 vol %. The fraction of the free space for an assembly of closely-packed spherical particles is about 26%. When the volume fraction of piezoelectric ceramic powders in 0-3 composites is more than 74%, cavities will be introduced unless there is some polydispersity in particle size. The presence of cavities has several effects. First, cavities will decrease the dielectric constant of 0-3 piezoelectric composites because these cavities are filled with air (that has a low dielectric constant of close to unity).

In some examples, the piezoelectric filler is present in an amount of about 40 vol %, about 50 vol %, or about 60 vol %.

Additives

The disclosed piezoelectric composite can comprise one or more additives conventionally used in the manufacture of molded thermoplastic parts with the proviso that the optional additives do not adversely affect the desired properties of the resulting composition. Mixtures of optional additives can also be used. Such additives can be mixed at a suitable time during the mixing of the components for forming the composite mixture.

In further aspects of the present disclosure, the piezoelectric composite can comprise a rubbery impact modifier. The rubber impact modifier can be a polymeric material which, at room temperature, is capable of recovering substantially in shape and size after removal of a force. However, the rubbery impact modifier should typically have a glass transition temperature of less than 0° C. In certain aspects, the glass transition temperature ($T_g$) can be less than −5° C., −10° C., −15° C., with a Tg of less than −30° C. typically providing better performance. Representative rubbery impact modifiers can include, for example, functionalized polyolefin ethylene-acrylate terpolymers, such as ethylene-acrylic esters-maleic anhydride (MAH) or glycidyl methacrylate (GMA). The functionalized rubbery polymer can optionally contain repeat units in its backbone which are derived from an anhydride group containing monomer, such as maleic anhydride. In another scenario, the functionalized rubbery polymer can contain anhydride moieties which are grafted onto the polymer in a post polymerization step.

In one example, the piezoelectric composite can comprise a core-shell copolymer impact modifier having about 80 wt. % of a core comprising poly(butyl acrylate) and about 20 wt. % of a shell comprising poly(methyl methacrylate). In a further example, the impact modifier can comprise an acrylic impact modifier such as ethylene-ethylacrylate copolymer with an ethyl acrylate content of less than 20 wt. % (such as EXL 3330 as supplied by SABIC). The composition can comprise about 5 wt. % of the ethylene-ethylacrylate copolymer.

Methods

In many aspects, the piezoelectric composite can be prepared according to a solution cast method. In solution casting, a polymer may be dissolved in a suitable solvent and applied to a substrate. Solution casting may result in uniform thickness distribution, higher dimensional stability and optical purity when compared to a traditional extrusion of molten polymer through a die. According to various aspects, the ferroelectric polymer of the present disclosure may be dissolved in an appropriate solvent. The polymer was dissolved in a solvent followed by the addition of PZT. Casting at a substrate may be performed using a blade, such as a doctor blade, for example. An added advantage of this technique is that the composite can be prepared quickly and the prototype process can easily be scaled up for production.

The polymer may be dissolved in a solvent to which PZT is added. The resulting solution may be casted using a doctor blade, for example. These composites were poled under a direct electric field and their piezoelectric and dielectric properties were determined. Processes of the present disclosure provide a faster, more scalable approach than conventional methods.

According to various aspects, a method of forming a piezoelectric composite may comprise processing a piezoelectric filler to form a piezoelectric powder. A polymer resin may be dissolved in an appropriate solvent to form a solution. The piezoelectric powder may be combined with the solution to form a dispersion. A piezoelectric composite film may be formed via a process of solution casting. In solution casting, the dispersion comprising piezoelectric particles may be applied or cast at an appropriate substrate surface where the film is formed via a process of curing or drying. In some examples, films of the piezoelectric composite may be formed by solvent evaporation. Other conventional processes may provide that the piezoelectric composite is obtained by first adding a non-solvent to a solution containing a mixture of the piezoelectric solution (comprising the dissolved polymer and PZT), and then separating the sample by filtration. The resulting sample can then be dried and hot-pressed to form the desired piezoelectric film. Examples of such non-solvents suitable for PVDF are alcohols, methylisobutyl ketone, aliphatic hydrocarbons, and cycloaliphatic hydrocarbons. Processes of the present disclosure avoid the need for hot-pressing in the formation of the piezoelectric composite.

Processing of the piezoelectric powder may comprise forming a particulate powder. Processing may refer to grinding or milling a piezoelectric fiber filler to provide a particulate form having a specific size. In various aspects, the piezoelectric filler may be processed to provide a piezoelectric powder or particulate having a particle size of from about 1 μm to about 3 μm. Processing of the piezoelectric powder may further comprise heating the piezoelectric powder to a temperature of at least 1050° C. to 1200° C., for example at least 1100° C. The heating step may improve crystallinity of the piezoelectric filler material.

Various solvents can be used for dissolution of the polymer. Exemplary solvents include of suitable solvents are ethylene carbonate, cyclohexanone, tetrahydrofuran, 1-butyrolactone, N,N-dimethylacetamide, N-methylpyrrolidone, and dimethyl sulfoxide. In one example, the solvent is tetrahydrofuran. The polymer resin and solvent may be combined in a ratio of 1:4 to 1:10. In a specific example, the polymer resin and solvent are combined in a ratio of about 1:8, polymer: solvent.

As provided herein, in evaluating the piezoelectric properties of the piezoelectric composite, the composite may be poled. Various poling methods are applicable for the composites of the present disclosure. These include direct current DC poling, corona poling, plasma poling, pulse poling, and poling under more varied voltage conditions (which may comprise various combinations of DC, AC, pulse, and corona poling) at either a single temperature or a range of temperatures. A specific method of poling is DC poling in a thermostatically temperature-controlled silicon oil bath, which is the method frequently used by investigators of piezoelectric materials.

In order to ensure most complete and rapid poling, the maximum poling field should be preferably as high a field as can be applied without causing dielectric breakdown of the composite. Conventional piezoelectric composites may have a poling voltage of 60 KV/mm (such as for PVDF), while the disclosed composites have a poling voltage of 10 KV/mm, enabling them for broader use.

Preferred poling temperatures are at least 10° C. below the highest polymer matrix melting temperature and more preferably at least 30° C. below the highest matrix melting temperature. There are two purposes of using high poling temperatures. First, high temperatures decrease the coercive field of the ceramic component. Second, high temperatures can increase the dielectric constant of the polymer component, so that the difference in dielectric constant between the ceramic and polymer decreases. In order to apply a high poling field, the poling field should be increased progressively from a low field that is far from the breakdown field to a field that is slightly less than the breakdown field.

Properties and Articles

In certain aspects, the compositions can exhibit improved elastic modulus, density, poling voltages, and piezoelectric sensitivity when compared to a conventional ferroelectric polymer (such as PVDF and its copolymers) or a bulk piezoelectric ceramic. The present disclosure provides a piezoelectric composite material with high flexibility and higher piezoelectric properties compared to conventional commercial material PVDF. More specifically, the $d_{33}$ of PVDF is about 21-30 pC/N, while $d_{33}$ for the disclosed piezocomposite is greater than 50 pC/N or from about 55-58 pC/N.

The disclosed piezoelectric composite also maintains flexibility, making the material desirable in a number of applications. Conventional PVDF-TrFE-CFE has an elastic modulus of about 0.28 GPa and the disclosed piezocomposite has an elastic modulus of about 0.9 GPa. Given the values for modulus, the conventional PVDF-TrFE-CFE would tend to be more flexible. However, as the piezo. The disclosed piezocomposite does however improve on the elastic modulus of ceramic piezoelectric fillers which as ceramics are often very brittle or rigid while having a high piezoelectric constant. Thus, the disclosed piezocomposites provide a balance among piezoelectric properties and flexibility.

Moreover, the disclosed piezoelectric composites may be more desirable in broader applications for their lightness. Compared to piezoelectric ceramics, the piezoelectric composites described herein have a lower density, i.e., for ceramics, the density may be about 8 g/cc, for piezocomposites the density may be about 5 g/cc. Density may be obtained for the disclosed compositions according to the Archimedes method, for example. The Archimedes method or principle provides that the density, p, is equal to the weight or mass in air (m) divided by the weight in water, $m_2$. The weight in water $m_2$, where the density of water is 1 gram per cubic centimeter (g/cm³), corresponds to the volume (v) of the object. Thus density is m/v.

With respect to poling voltages, the disclosed piezocomposites have a lower poling voltage when compared to PVDF. Generally, for PVDF the poling voltage is 60 KV/mm, while for the disclosed piezocomposite, the poling voltage is about 10 KV/mm. The disclosed piezoelectric composites require a low processing temperature and lower processing costs when compared to PVDF and PVDF copolymers. Despite the presence of PVDF-TrFE-CFE as the ferroelectric fluoropolymer matrix, the amount of polymer required to form the composite is generally reduced more than 90 percent by mas thus reducing the overall cost. The simple fabrication process is more cost effective when compared with other conventional processes of forming PVDF.

The prepared composite may exhibit certain performance properties with respect to the dielectric constant. For example, the composite may exhibit a dielectric constant dk greater than 100 when derived from capacitance measurement at 1 kHz and 1 V.

Piezoelectric composites of the present disclosure maintain their piezoelectric properties at elevated temperatures while certain conventional materials do not. PVDF and PVDF based copolymers may lose their piezoelectric activity at temperatures from about 60-80° C. The disclosed piezoelectric composites provided herein were tested retained piezoelectric properties (i.e., $d_{33}$ remained within 5 units) at temperatures up to about 110° C. The composites retained the piezoelectric properties without depoling.

Given the foregoing properties, the disclosed piezoelectric composites may be useful in a diverse array of applications. Potential applications may include simple touch panel replacements, energy harvesting, human machine interface techniques, integrated keyboards on table, functionalities to display media, among others. In a specific example, the disclosed piezoelectric composites may be useful in the field of wearable technology such as smart watches. Smart watches may incorporate eccentric rotating mass (ERM) to create vibrations. These watches can be connected to a smart phone via Bluetooth and a unique rhythm of vibrations can be assigned to each individual caller. This way without looking at the phone screen or the watch display, one can know about the person making a call. This is one of the features of smart watches with plenty of other possibilities including (but not limited to) sport training, video games etc. For human machine interaction or for wearable devices, new class of materials are required which are easy to process, mechanically flexible and also operate at lower voltages, all at the same time. Utilizing thermoplastic or thermoset polymer based piezoelectric composites, mechanical flexibility with high piezoelectric constant is observed with ease of processing and cost effectiveness.

The ERM has been replaced by linear actuators (LA) due to their heavy mass. LA are incorporated in the watch itself and not around the strap as they are not flexible. Linear actuators use a voice coil which is pressed against a mass attached to a spring. The spring vibrates at the resonance frequency when an alternating current AC field is applied to the coil hence vibrating the mass. These linear actuators are relatively lighter than ERM however still heavier due to its construction and mass attached to it. They also have large volume (making the watch body thick) and are typically not flexible. PVDF may be an existing conventional option; however, the material is generally expensive to produce and increases the cost of the watch. Conversely, the disclosed piezocomposites provide ease of manufacture, are flexible, and provide higher blocking forces than conventional PVDF-based actuators. Replacing linear actuators with the disclosed piezocomposite may allow for both a thinner watch and a generally less expensive device.

In various further aspects, the present disclosure relates to articles comprising the compositions herein. The composites can be useful in the manufacture of articles requiring materials with piezoelectric sensitivity, low poling voltage, and flexibility.

In a further aspect, non-limiting examples of fields in which the piezoelectric composites may be employed can include electrical, electro-mechanical, radio frequency (RF) technology, telecommunication, automotive, aviation, medical, sensor, military, and security. In a still further aspect, the thermoplastic compositions can also be present in overlapping fields, such as mechatronic systems that integrate mechanical and electrical properties which can, for example, be used in automotive or medical engineering.

In a further aspect, the suitable article can be an electronic device, automotive device, telecommunication device, medical device, security device, or mechatronic device. In a still further aspect, the article can be selected from a computer device, electromagnetic interference device, printed circuit, Wi-Fi device, Bluetooth device, global positioning system GPS device, cellular antenna device, smart phone device, automotive device, medical device, sensor device, security device, shielding device, radio frequency RF antenna device, light emitting diode LED device, and radio frequency identification RFID device. In yet a further aspect, the article can be selected from a computer device, sensor device, security device, RF antenna device, LED device and RFID device.

In a further aspect, the resulting disclosed compositions can be used to provide any desired shaped, formed, or molded articles. For example, the disclosed compositions can be molded into useful shaped articles by a variety of means such as injection molding, extrusion, rotational molding, blow molding and thermoforming. As noted above, the disclosed compositions are particularly well suited for use in the manufacture of electronic components and devices. As such, according to some aspects, the disclosed compositions can be used to form articles such as printed circuit board carriers, burn in test sockets, flex brackets for hard disk drives, and the like.

Definitions

It is to be understood that the terminology used herein is for the purpose of describing particular aspects only and is not intended to be limiting. As used in the specification and in the claims, the term "comprising" can include the aspects "consisting of" and "consisting essentially of." Unless defined otherwise, all technical and scientific terms used herein have the same meaning as commonly understood by one of ordinary skill in the art to which this disclosure belongs. In this specification and in the claims which follow, reference will be made to a number of terms which shall be defined herein.

As used in the specification and the appended claims, the singular forms "a," "an" and "the" include plural equivalents unless the context clearly dictates otherwise. Thus, for example, reference to "a polycarbonate polymer" includes mixtures of two or more polycarbonate polymers.

As used herein, the term "combination" is inclusive of blends, mixtures, alloys, reaction products, and the like.

Ranges can be expressed herein as from one particular value to another particular value. When such a range is expressed, another aspect includes from the one particular value and/or to the other particular value. Similarly, when values are expressed as approximations, by use of the antecedent 'about,' it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "about" and "at or about" mean that the amount or value in question can be the value designated some other value approximately or about the same. It is generally understood, as used herein, that it is the nominal value indicated ±5% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Disclosed are the components to be used to prepare the compositions of the disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the disclosure. Thus, if there are a variety of additional steps that can be performed it is understood that each of these additional steps can be performed with any specific aspect or combination of aspects of the methods of the disclosure.

The term "dielectric" as used herein, generally refers to the property of transmitting electric force without conduction. Dielectric indicates the energy soring capacity of a given material.

As used herein, "ferroelectric polymer" describes a class of a group of crystalline polar polymers that maintain a permanent electric polarization that can be reversed, or switched, in an external electric field. A "relaxor ferroelectric polymer" is a type of ferroelectric polymer that exhibits high electrostrictive strain (about 7%) and high elastic energy density (about 1 J/cm$^3$).

The term "actuator," refers to a material that converts electric energy to mechanical energy in response to an electric potential. The term "sensor" with respect to a piezoelectric material refers to a material that converts mechanical energy into electrical energy in response to a mechanical force. The terms "piezoelectric constant" ($d_{33}$) as used herein, refers to the polarization generated per unit of mechanical stress (T) applied to a piezoelectric material or, alternatively, is the mechanical strain (S) experienced by a piezoelectric material per unit of electric field applied. The piezoelectric constant may also be referred to as the piezoelectric sensitivity of a given material.

Unless otherwise stated to the contrary herein, any test standards described are the most recent standard in effect at the time of filing this application.

Aspects

Aspect 1A. A composite comprising: a piezoelectric filler; and a polymer resin, wherein the piezoelectric filler is present in an amount from about 30 vol % to about 70 vol % based on the total volume of the composite, wherein the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 1B. A composite consisting essentially of: a piezoelectric filler; and a polymer resin, wherein the piezoelectric filler is present in an amount from about 30 vol % to about 70 vol % based on the total volume of the composite, wherein the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 1C. A composite consisting of: a piezoelectric filler; and a polymer resin, wherein the piezoelectric filler is present in an amount from about 30 vol % to about 70 vol % based on the total volume of the composite, wherein the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 2A. A composite comprising: a piezoelectric filler; and a polymer resin, wherein the piezoelectric filler is present in an amount from about 40 vol % to about 60 vol % based on the total volume of the composite, wherein the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 2B. A composite consisting of: a piezoelectric filler; and a polymer resin, wherein the piezoelectric filler is present in an amount from about 40 vol % to about 60 vol % based on the total volume of the composite, wherein the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 2C. A composite consisting essentially of: a piezoelectric filler; and a polymer resin, wherein the piezoelectric filler is present in an amount from about 40 vol % to about 60 vol % based on the total volume of the composite, wherein the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 3A. A composite comprising: a piezoelectric filler; and a polymer resin, wherein the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 3B. A composite consisting essentially of: a piezoelectric filler; and a polymer resin, wherein the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 3C. A composite consisting of: a piezoelectric filler; and a polymer resin, wherein the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 4A. A composite comprising: a polymer resin; and a piezoelectric filler, wherein the piezoelectric filler is present in an amount from about 30 vol % to about 70 vol % based on the total volume of the composite, the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 4B. A composite consisting essentially of: a polymer resin; and a piezoelectric filler, wherein the piezoelectric filler is present in an amount from about 30 vol % to about 70 vol % based on the total volume of the composite, the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 4C. A composite consisting of: a polymer resin; and a piezoelectric filler, wherein the piezoelectric filler is present in an amount from about 30 vol % to about 70 vol % based on the total volume of the composite, the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 5. The composite of aspect 4, wherein the piezoelectric filler is present in an amount from about 40 vol % to about 60 vol % based on the total volume of the composite.

Aspect 6. The composite of any of aspects 4-5, wherein the polymer resin comprises a thermoplastic fluoropolymer.

Aspect 7. The composite of any of aspects 4-5, wherein the polymer resin comprises polyvinylidene difluoride.

Aspect 8A. A composite comprising: a polyvinylidene difluoride resin; and a piezoelectric filler, wherein the piezoelectric filler is present in an amount from about 30 vol % to about 70 vol % based on the total volume of the composite, the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 8B. A composite consisting essentially of: a polyvinylidene difluoride resin; and a piezoelectric filler, wherein the piezoelectric filler is present in an amount from about 30 vol % to about 70 vol % based on the total volume of the composite, the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 8C. A composite consisting of: a polyvinylidene difluoride resin; and a piezoelectric filler, wherein the piezoelectric filler is present in an amount from about 30 vol % to about 70 vol % based on the total volume of the composite, the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 9. The composite of aspect 8, wherein the piezoelectric filler is present in an amount from about 40 vol % to about 60 vol % based on the total volume of the composite.

Aspect 10A. A composite comprising: a poly(vinylidene fluoride-trifluoroethylene-chlorofluoroethylene) resin; and a piezoelectric filler, wherein the piezoelectric filler is present in an amount from about 30 vol % to about 70 vol % based on the total volume of the composite, the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 10B. A composite consisting essentially of: a poly(vinylidene fluoride-trifluoroethylene-chlorofluoroethylene) resin; and a piezoelectric filler, wherein the piezoelectric filler is present in an amount from about 30 vol % to about 70 vol % based on the total volume of the composite, the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 10C. A composite consisting of: a poly(vinylidene fluoride-trifluoroethylene-chlorofluoroethylene) resin; and a piezoelectric filler, wherein the piezoelectric filler is present in an amount from about 30 vol % to about 70 vol % based on the total volume of the composite, the composite exhibits a piezoelectric coefficient $d_{33}$ of greater than 30 pC/N when measured according to the Berlincourt Method using a d33 piezometer, the composite is oriented at a poling voltage lower than a substantially similar polymer matrix in the absence of the piezoelectric filler when subjected to an electric field, the composite exhibits an elastic modulus of less than 30 GPa when tested according to ASTM D3039, and the composite exhibits a density of less than 5 g/cc according to the Archimedes method.

Aspect 11. The composite of aspect 10, wherein the piezoelectric filler is present in an amount from about 40 vol % to about 60 vol % based on the total volume of the composite.

Aspect 12. The composite of any of aspects 1-11, wherein the piezoelectric filler is a particulate dispersed throughout the polymer resin.

Aspect 13. The composite of any of aspects 1-12, wherein the piezoelectric filler is a particulate having an average particle size of from about 1 to about 3 microns.

Aspect 14. The composite site of any of aspects 1-13, wherein the piezoelectric filler comprises a lead-based piezoelectric filler.

Aspect 15. The composite of any of aspects 1-13, wherein the piezoelectric filler comprises lead zirconium titanate.

Aspect 16. The composite of any of aspects 1-15, wherein the piezoelectric filler has a piezoelectric sensitivity of $d_{33}$.

Aspect 17. The composite of any of aspects 1-16, wherein the composite further comprises an additive.

Aspect 18. An article comprising the composite of any of aspects 1-19.

Aspect 19. The article of aspect 13, wherein the article is a component of a touch panel, a human machine interface, an integrated keyboard, or a wearable device.

Aspect 20A. A method of forming a piezoelectric composite, the method comprising: processing a piezoelectric filler to form a piezoelectric powder, wherein the piezoelectric powder comprises particulate having a size of from about 1 μm to about 3 μm; combining a polymer resin and a solvent to provide a solution; combining the piezoelectric powder with the solution to provide a piezoelectric solution; and forming a film from the piezoelectric solution.

Aspect 20B. A method of forming a piezoelectric composite, the method consisting essentially of: processing a piezoelectric filler to form a piezoelectric powder, wherein the piezoelectric powder comprises particulate having a size of from about 1 μm to about 3 μm; combining a polymer resin and a solvent to provide a solution; combining the piezoelectric powder with the solution to provide a piezoelectric solution; and forming a film from the piezoelectric solution.

Aspect 20C. A method of forming a piezoelectric composite, the method consisting of: processing a piezoelectric filler to form a piezoelectric powder, wherein the piezoelectric powder comprises particulate having a size of from about 1 μm to about 3 μm; combining a polymer resin and a solvent to provide a solution; combining the piezoelectric powder with the solution to provide a piezoelectric solution; and forming a film from the piezoelectric solution.

Aspect 21. The method of aspect 20, wherein the processing comprises milling.

Aspect 22. The method of any of aspects 20-21, wherein the processing comprises heating the piezoelectric powder to a temperature of at least 1050° C. to 1200° C.

Aspect 23. The method of any of aspects 20-21, wherein the processing comprises heating the piezoelectric powder to a temperature of at least 1100° C.

Aspect 24. The method of any of aspects 20-23, wherein the polymer comprises poly(vinylidene fluoride-trifluoroethylene-chlorofluoroethylene).

Aspect 25. The method of any of aspects 20-24, wherein the piezoelectric filler comprises lead zirconium titanate.

Aspect 26. The method of any of claims 20-25, wherein the polymer resin and solvent are combined in a ratio from 1:4 to 1:10.

Examples

Detailed aspects of the present disclosure are disclosed herein; it is to be understood that the disclosed aspects are merely exemplary of the disclosure that may be embodied in various forms. Therefore, specific structural and functional details disclosed herein are not to be interpreted as limits, but merely as a basis for teaching one skilled in the art to employ the present disclosure. The specific examples below will enable the disclosure to be better understood. However, they are given merely by way of guidance and do not imply any limitation.

The following examples are provided to illustrate the compositions, processes, and properties of the present disclosure. The examples are merely illustrative and are not intended to limit the disclosure to the materials, conditions, or process parameters set forth therein.

General Materials and Methods

The compositions as set forth in the Examples below were prepared from the components presented in Table 1.

Table 1. Composite components.

TABLE 1

| Composite components. | | |
|---|---|---|
| | Description | Source |
| PVDF-TrFE-CFE | Poly(vinylidene fluoride-trifluoroethylene-chlorofluoroethylene); RT ™-CFE Standard Composition Powder | Piezotech |
| PZT | Lead Zirconium Titanate | Ferroperm |

The compositions as set forth in the Examples below were prepared from the components presented in Table 1.

Lead zirconium titanate was treated at 1100° C. for 1 hour followed by ball milling process for 3 hours. PVDF-TrFE-CFE was dissolved in tetrahydrofuran (THF) by magnetic stirring with a polymer to solvent ratio of 1:8 at 25° C. for 1 hours in an oil bath at a speed of 50 rpm. After complete dissolution of the polymer, different volume fractions of PZT were added to the solution and stirred at 300 revolutions per minute (rpm) for 30 minutes to completely homogenize the PZT powder inside the PVDF solution. After homogenization, the mixture was casted onto a glass plate wrapped with an aluminum foil and aluminum coated polyethylene terephthalate PET foil. The casted films were dried at room temperature and subsequently annealed at 110° C. for 2-5 hours under atmospheric conditions. The samples were poled at 110° C. for half hour under 10 KV/mm.

Molded samples were tested in accordance with the standards and procedures presented below.

Values for piezoelectric constant $d_{33}$ were obtained according to the Berlincourt method using a piezometer. Sample size was 100 μm to 2 mm thick with an area of 0.5 square centimeters (cm$^2$) to 2 cm$^2$. FIG. 1 shows the piezoelectric constant d$_{33}$ as a function of the volume percent of PZT in the composite sample. As shown, the 40 vol % PZT composite exhibited lower d$_{33}$ values than the 50 vol % and 60 vol % PZT composites.

Figure 2:
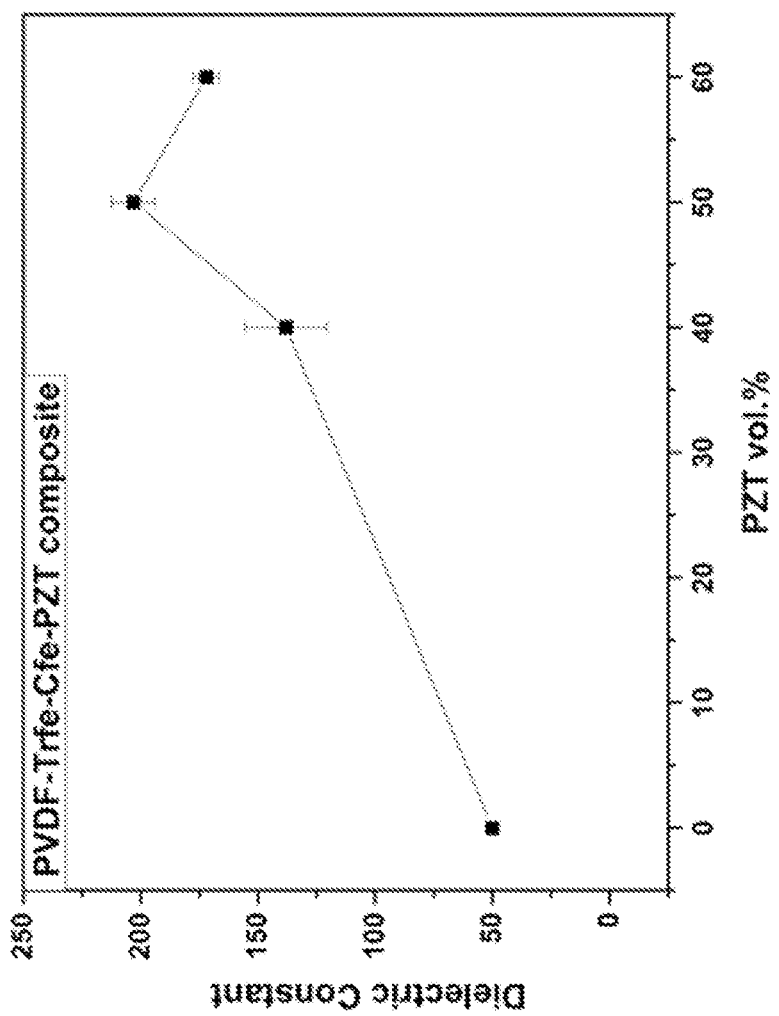
FIG. 2 is a graphical representation of the variation of the dielectric constant with increasing PZT volume fraction.

Values for the dielectric constant dk were derived from capacitance measurements according to a parallel plate capacitor method and the equation dk=C*d/A*ε0, where C is capacitance, d is the thickness, A is the area of electrode and ε0 is the permittivity of vacuum. Capacitance measurements were obtained using a capacitance meter at 1 kHz and 1 V. Sample size was 100 μm to 2 mm with an area of 0.5 cm$^2$ to 2 cm$^2$. FIG. 2 shows the dielectric constant as a function of the volume percent of PZT in the composite sample. Again, the 40 vol % PZT composite exhibited lower dk values than the 50 vol % and 60 vol % PZT composites. However, at 60 vol % PZT, it appeared that the dk decreased.

Figure 3A:
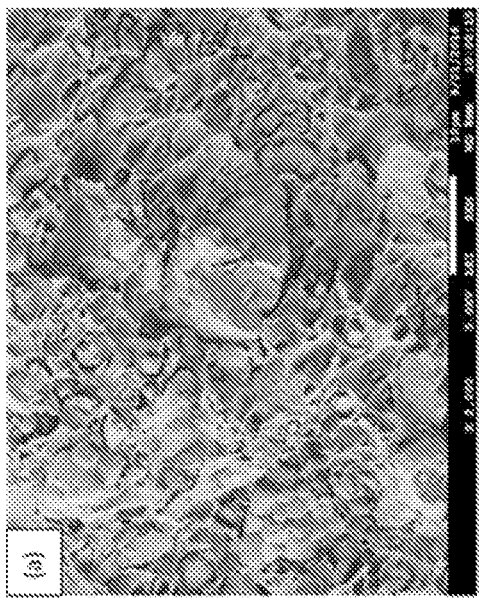
FIGS. 3A-3C are scanning electron microscope (SEM) micrographs of vinylidene fluoride-trifluoroethylene-chlorofluoroethylene terpolymer, PVDF-TrFE-CFE-PZT composites at 40 volume percent, 50 volume percent, and 60 volume percent PZT.
Figure 3B:
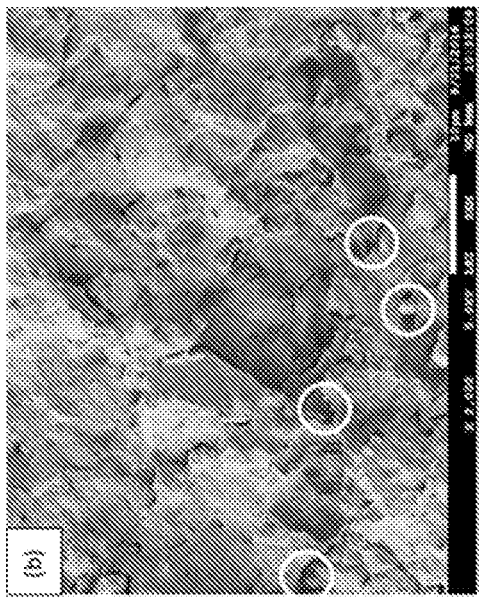
Figure 3C:
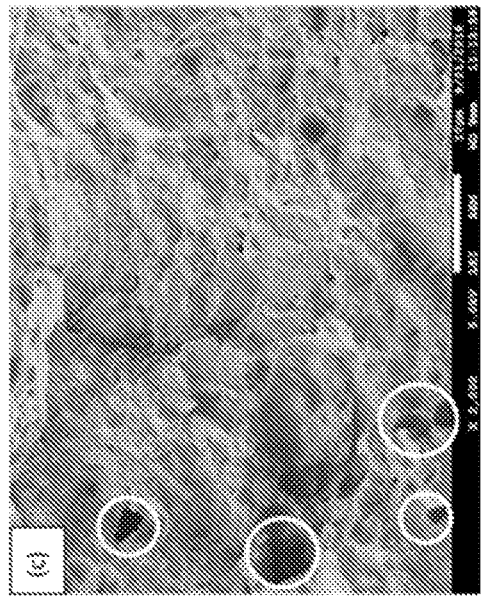

A scanning electron microscope (ESEM, JSF 7800F, JEOL,) was used to acquire micrographs and evaluate the porosity of the composites at 40, 50, and 60 volume percent of PZT. FIGS. 3A-3C present the micrographs for samples at 40, 50, and 60 vol %, respectively. White circles in the SEM micrograph highlighting darker bodies represent "holes" or the porosity in the composite. FIG. 3A exhibited minimal porosity in the composite at 40 vol % PZT as shown in the lack of significant darker bodies highlighted by white circles. FIG. 3B shows increasing porosity for the 50 vol % PZT characterized by the presence of darker bodies/areas encircled in white. FIG. 3C shows level of porosity for the 60 vol % PZT where the darker bodies/areas are larger with correspondingly larger white circles. The 60 vol % PZT composite also exhibited flexibility in that the sample was readily flexed or folded over. Too much porosity indicates too many holes which may result in a breakdown in electricity. This may be consistent with the dielectric performance described above. Thus a balance among porosity (for flexibility) and piezoelectricity is desirable. The 50 vol % composite appeared to strike a desirable balance between porosity and maintaining piezoelectricity.

Figure 4:
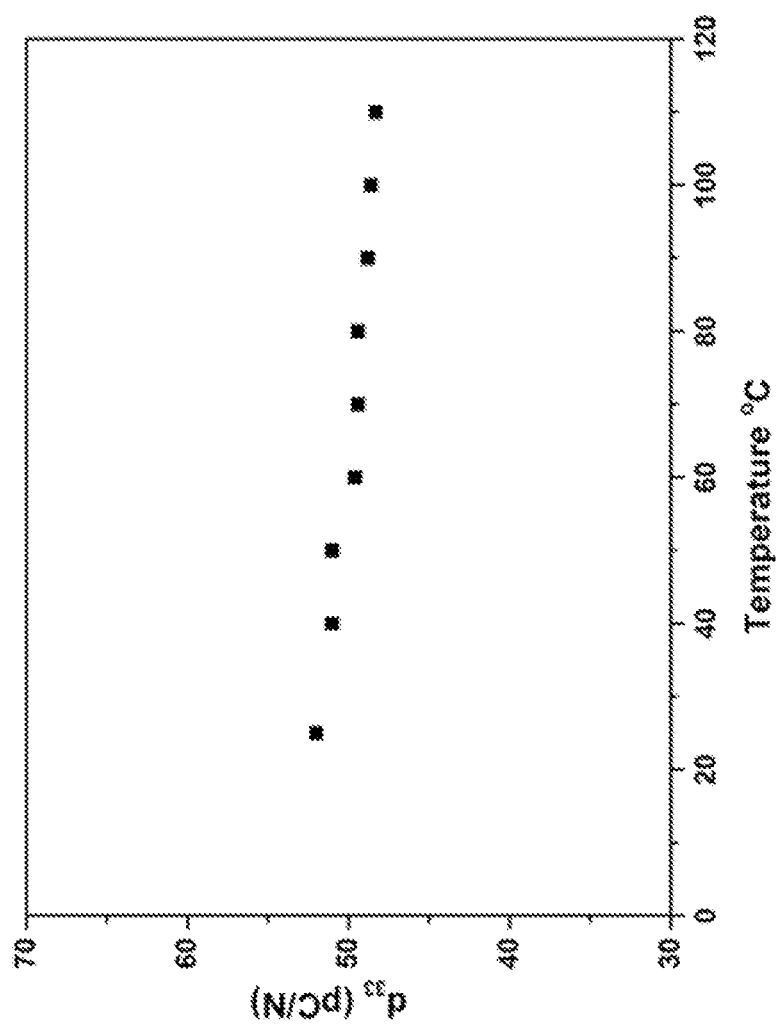
FIG. 4 is a graphical representation of the piezoelectric constant $d_{33}$ at various temperatures for the 50 volume percent PZT composite.

The 50 vol % PZT composite was also examined for stability at a range of temperatures. FIG. 4 shows the piezoelectric constant d$_{33}$ as a function of temperature. The 50 vol % composite appears to maintain value within ±5 units.

Poling voltage was tested by gradually increasing the voltage and measuring the subsequent d$_{33}$. Poling voltage was determined when the highest d$_{33}$ was achieved. It is noted that the poling voltage is limited by electrical breakdown.

Figures 5A, 5B:
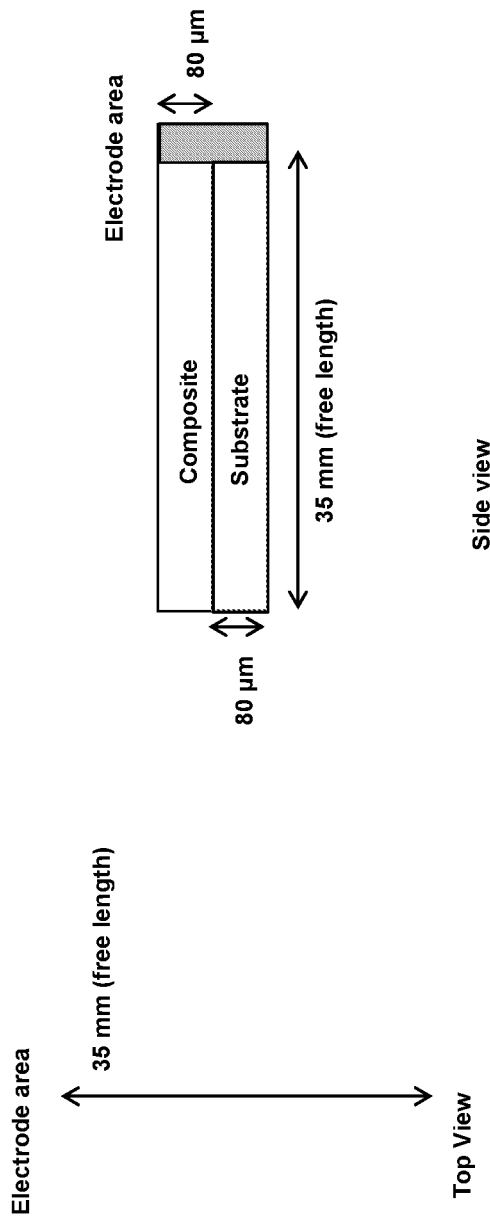
FIGS. 5A-B are diagrams for the evaluation of the deflection and blocking force of PVDF-TrFE-CFE-PZT composite at 60 volume percent PZT.

A deflection and blocking evaluation was also performed on a sample of the 60 vol % PZT composite. Blocked force (Fb) refers to the force exerted at the maximum recommended voltage level when the actuator is totally blocked and not allowed to move. Generally, a piezo motor must move a specified amount and exert a specified force, which determines its operating point on the force vs. deflection line. The dimensions of the sample were 35 mm by 5.25 mm. FIGS. 5A and 5B shows a diagram of top and side views, respectively, of the testing sample and electrode arrangement for testing. The substrate was a metal foil having a thickness of 80 μm upon which 80 μm of composite film was solution casted. Actuation of the sample was performed by applying a voltage over the sample in the thickness direction. With actuation the sample begins to bend until there's no force, i.e., force is zero. At the highest voltage applied, the actuator reaches maximum deflection and the force becomes zero. A laser was used to measure the magnitude of deflection or bending. A force meter was used to measure the blocking force by pushing the actuator back to its original position and measuring the force.

Figure 6:
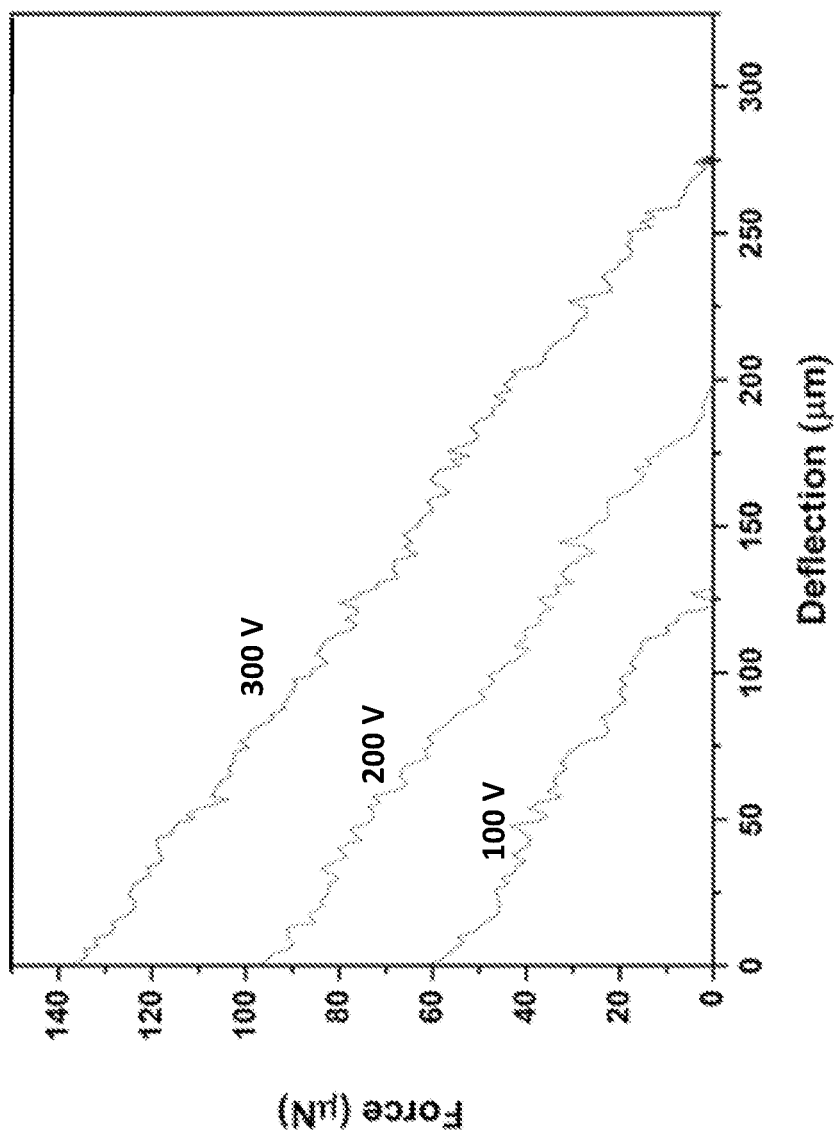
FIG. 6 is a graphical representation of the deflection and blocking force of the PVDF-TrFE-CFE-PZT composite at 60 volume percent PZT measured at 100 V, 200 V, and 300 V.

Values for deflection and blocking were measured at 100 V, 200 V and 300 V. As shown in FIG. 6, the maximum blocking force of 140 microNewtons (μN) was measured with a maximum displacement of 277 μm. The observed force decreased as deflection decreased.

The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed:

1. A composite comprising:
   a piezoelectric filler; and
   a polymer resin comprising a poly(vinylidene fluoride-trifluoroethylene)-based terpolymer,
   wherein
   the composite exhibits a piezoelectric coefficient d$_{33}$ of greater than 30 pC/N when measured according to the Berlincourt Method using a d$_{33}$ piezometer,
   the composite is oriented at a poling voltage lower than a substantially similar polymer matrix in the absence of the piezoelectric filler when subjected to an electric field,
   the composite exhibits an elastic modulus of less than 30 GPa when tested according to ASTM D3039, and
   the composite exhibits a density of less than 5 g/cc according to the Archimedes method.

2. The composite of claim 1, wherein the piezoelectric filler is present in an amount from about 30 vol % to about 70 vol % based on the total volume of the composite.

3. The composite of claim 2, wherein the piezoelectric filler is present in an amount from about 40 vol % to about 60 vol % based on the total volume of the composite.

4. The composite of claim 2, wherein the piezoelectric filler is a particulate dispersed throughout the polymer resin.

5. The composite of claim 2, wherein the piezoelectric filler is a particulate having an average particle size of from about 1 to about 3 microns.

6. The composite of claim 2, wherein the piezoelectric filler comprises a lead-based piezoelectric filler.

7. The composite of claim 2, wherein the piezoelectric filler comprises lead zirconium titanate.

8. The composite of claim 2, wherein the piezoelectric filler has a piezoelectric sensitivity d$_{33}$ of at least 100 pC/N.

9. The composite of claim 1, wherein the composite further comprises an additive.

10. The composite of claim 1, wherein the poly(vinylidene fluoride-trifluoroethylene)-based terpolymer comprises poly(vinylidene fluoride-trifluoroethylene-chlorofluoroethylene).

11. An article comprising the composite of claim 1.

12. The article of claim 11, wherein the article is a component of a touch panel, a human machine interface, an integrated keyboard, or a wearable device.

13. A method of forming a piezoelectric composite, the method comprising:
   processing a piezoelectric filler to form a piezoelectric powder, wherein the piezoelectric powder comprises particulate having a size of from about 1 μm to about 3 μm;

combining a polymer resin and a solvent to provide a solution, wherein the polymer resin comprises a poly(vinylidene fluoride-trifluoroethylene)-based terpolymer;

combining the piezoelectric powder with the solution to provide a piezoelectric solution; and forming a film from the piezoelectric solution.

14. The method of claim 13, wherein the processing comprises milling.

15. The method of claim 13, wherein the processing comprises heating the piezoelectric powder to a temperature of at least 1050° C. to 1200° C.

16. The method of claim 13, wherein the processing comprises heating the piezoelectric powder to a temperature of at least 1100° C.

17. The method of claim 13, wherein the poly(vinylidene fluoride-trifluoroethylene)-based terpolymer comprises poly(vinylidene fluoride-trifluoroethylene-chlorofluoroethylene).

18. The method of claim 13, wherein the piezoelectric filler comprises lead zirconium titanate.

19. The method of claim 13, wherein the polymer resin and the solvent are combined in a ratio from 1:4 to 1:10.

* * * * *